(12) United States Patent
Karaki et al.

(10) Patent No.: US 7,418,676 B2
(45) Date of Patent: Aug. 26, 2008

(54) ASYNCHRONOUS CIRCUIT DESIGN TOOL AND COMPUTER PROGRAM PRODUCT

(75) Inventors: Nobuo Karaki, Matsumoto (JP); Tak Kwan Lee, Irvine, CA (US)

(73) Assignee: Seiko Epson Corporation, Tokyo (JP)

( * ) Notice: Subject to any disclaimer, the term of this patent is extended or adjusted under 35 U.S.C. 154(b) by 85 days.

(21) Appl. No.: 11/037,139

(22) Filed: Jan. 19, 2005

(65) Prior Publication Data

US 2006/0190851 A1 Aug. 24, 2006

(51) Int. Cl.
*G06F 17/50* (2006.01)

(52) U.S. Cl. ......................................... 716/3

(58) Field of Classification Search ............... 716/6, 716/10, 3

See application file for complete search history.

(56) References Cited

U.S. PATENT DOCUMENTS

| | | | |
|---|---|---|---|
| 6,785,875 B2 * | 8/2004 | Beerel et al. ................... 716/6 |
| 2004/0158802 A1 * | 8/2004 | Wong et al. ..................... 716/3 |
| 2005/0013356 A1 * | 1/2005 | Moacanin et al. ............ 375/224 |
| 2005/0226412 A1 * | 10/2005 | Selve et al. .................. 380/201 |
| 2006/0056269 A1 * | 3/2006 | Chiba .......................... 365/233 |
| 2006/0125666 A1 * | 6/2006 | Hanks ......................... 341/143 |

OTHER PUBLICATIONS

Alain J. Martin, "Synthesis of Asynchronous VLSI Circuits", California Institute of Technology; pp. 8-52 (Chapters 2-4), Mar. 22, 2000.*
Renaudin et al.; A Design Framework for Asynchronous/Synchronous Circuits Based on CHP to HDL Translation; 1999; pp. 135-144.*

* cited by examiner

*Primary Examiner*—Jack Chiang
*Assistant Examiner*—Suresh Memula
(74) *Attorney, Agent, or Firm*—Oliff & Berridge, PLC

(57) ABSTRACT

It is the object of the present invention to provide asynchronous circuit design tools for those engineers who are versed in standard hardware description languages (HDLs), which is widely used in industry mainly for synchronous circuit design, to design asynchronous circuits with relative ease. To accomplish the object, the asynchronous circuit design tools of the present invention include a translator for transforming a code written in an asynchronous circuit design language, which is based on a standard HDL and includes minimal primitives for describing the communications between asynchronous circuit blocks or processes, into a code written in a standard HDL, which is originally developed for synchronous circuit design. The codes transformed into the standard HDL can be functionally verified by using commercially available simulators, which are originally developed for verifying synchronous circuit design.

9 Claims, 19 Drawing Sheets

CONFIGURATION OF COMMUNICATIONS BETWEE PROCESSES

2-PHASE HANDSHAKING

4-PHASE HANDSHAKING

| TYPE | ATTRIBUTE 1 | ATTRIBUTE 2 | ATTRIBUTE OF OPOPOSITE PORT |
|---|---|---|---|
| ACTIVE INPUT | ACTIVE | INPUT | PASSIVE OUTPUT |
| ACTIVE OUTPUT | | OUTPUT | PASSIVE INPUT |
| PASSIVE INPUT | PASSIVE | INPUT | ACTIVE OUTPUT |
| PASSIVE OUTPUT | | OUTPUT | ACTIVE INPUT |
FIG. 5
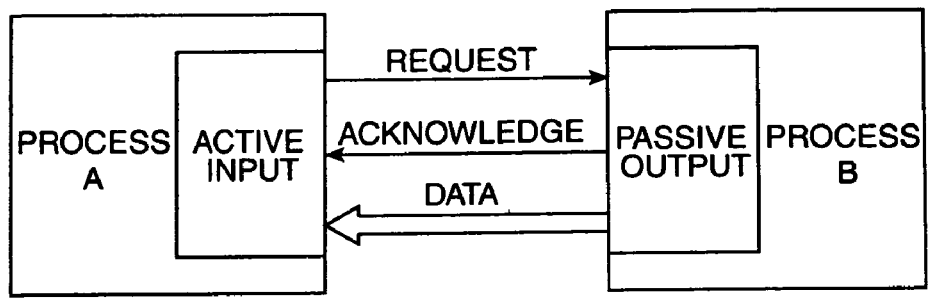
PORT ATTRIBUTES AND CHANNEL SIGNALS
FIG. 6
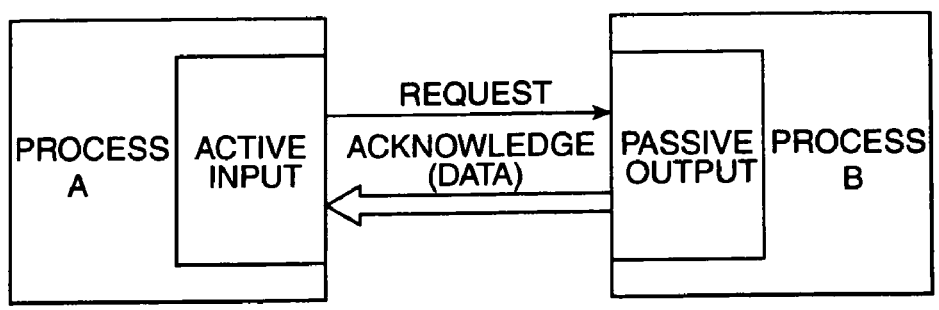
PASSIVE OUTPUT DATA
DUAL-RAIL ENCODING
FIG. 7

ACTIVE OUTPUT DATA
DUAL-RAIL ENCODING

HANDSHAKE CIRCUIT

```
module A(RESET,.. ,Pa1,.. ,Pa2,.. );
input REST;
reg [1:0]regA;
  ..
    cport active input [1:0] Pa1;
    cport active output [1:0] Pa2;
  ..
      always wait(!RESET)
      begin
           receive( Pa1,regA);
           send( Pa2,regA);
      end
  ..
    endmodule
```

ASYNCHRONOUS DESIGN
DESCRIPTION OF PROCESS A

FIG.10

```
module B(RS,.. ,Pb1,.. ,Pb3,.. );
  ..
    cport passive output [1:0] Pb1;
    cport passive intput [1:0] Pb3;
  ..
           send( Pb1,b1);
  ..
           receive( Pb3,b3);
  ..
    end
```

ASYNCHRONOUS DESIGN
DESCRIPTION OF PROCESS B

FIG.11

```
module C(RS,.. ,Pc2,.. ,Pc3,.. );
  ..
    cport passive input [1:0] Pc2;
    cport passive output [1:0] Pc3;
  ..
        receive( Pb2,b2);
  ..
        send( Pb3,b3);
  ..
    end
```
ASYNCHRONOUS DESIGN
DESCRIPTION OF PROCESS C
FIG.12
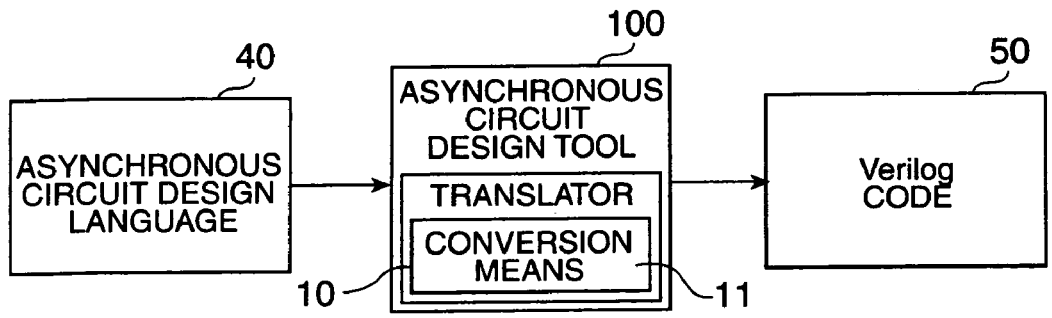
FIG.13
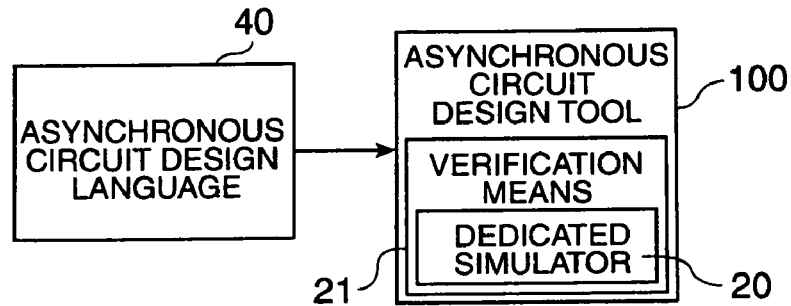
FIG.14

```
module A(RESET,.. ,Pa1_req,Pa1_data,.. ,Pa2_data,Pa2_ack,.. );
reg [1:0]regA;
input RESET;
output Pa1_req;
    input [1:0] Pa1_data;
    output [1:0] Pa2_data;
    input Pa2_ack;
  ..
        always wait(!RESET)
        begin
            begin
                force Pa1_req=1'b1;
                wait (Pa1_data !==2'bz);
                reg A=Pa1_data ;
                release Pa1_req;
                wait (Pa1_data !===2'bz);
            end
            ..
            begin
                force Pa2_data = regA;
                wait (Pa2_ack !== 1'bz);
                release Pa2_data;
                wait (Pa2_ack !=== 1'bz);
            end
        end
    ..
    endmodule
```

Verilog CODE CONVERSION EXAMPLE OF PROCESS A

FIG.15

```
module TOP (.. );
..
channel [1:0] CH1;
channel [1:0] CH2;
channel [1:0] CH3;
..
        A A1 ( .. ,CH1,.. , CH2,.. );
        B B1 ( .. ,CH1,.. , CH3,.. );
        A C1 ( .. ,CH2,.. , CH3,.. );
..
    end
```

ASYNCHRONOUS DESIGN
DESCRIPTION OF HANDSHAKE CIRCUIT

FIG.16

```
module TOP (.. );
..
wire CH1_ctrl;
wire [1:0] CH1_data;
wire CH2_ctrl;
wire [1:0] CH2_data;
wire CH3_ctrl;
wire [1:0] CH3_data;
..
        A A1 ( .. ,CH1_ctrl, CH1_data,.. , CH2_ctrl, CH2_data,.. );
        B B1 ( .. ,CH1_ctrl, CH1_data,.. , CH3_ctrl, CH3_data,.. );
        A C1 ( .. ,CH2_ctrl, CH2_data,.. , CH3_ctrl, CH3_data,.. );
..
end
```

Verilog CODE OF HANDSHAKE CIRCUIT

FIG.17

|  |  | input | | |
|---|---|---|---|---|
|  |  | "0" | "1" | Null |
| output | dn.0 | 1 | 0 | 0 |
|  | dn.1 | 0 | 1 | 0 |
DUAL-RAIL ENCODING
FIG.18
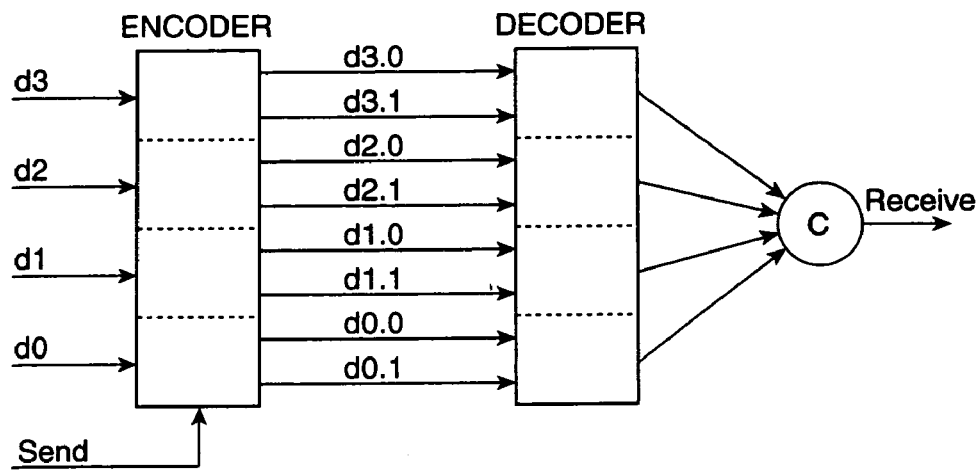
DUAL-RAIL ENCODER/DECODER
FIG.19
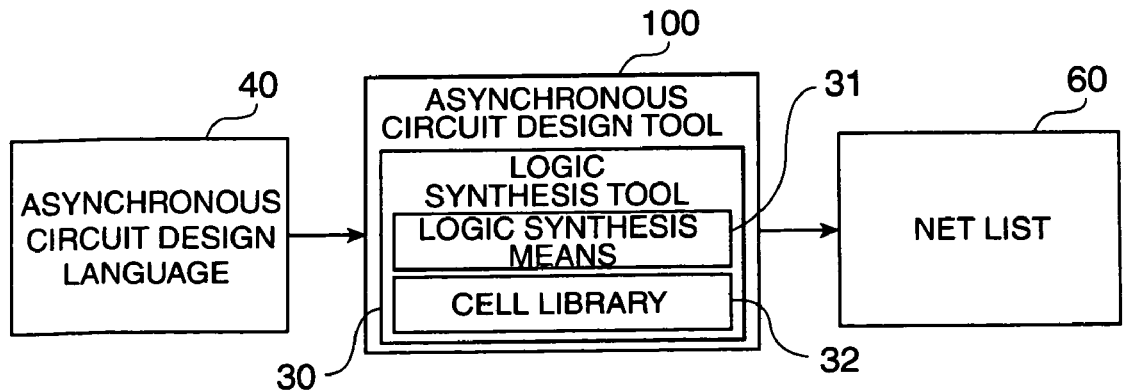
FIG.20

```
module A(RESET,.. ,Pa1_c,Pa1_d,.. ,Pa2_c,Pa2_d,.. );
input RESET;
wire [1:0] regA,regA_;
output Pa1_c;
input [3:0] Pa1_d;
input Pa2_c;
output [3:0] Pa2_d;
..
wire X0_d,X1_c,X1_d,X2_d,X8_c,X8_dd;
..
    reg_simple Xcell0(regA[0],regA_[0],X1_d,Pa1_d[0],Pa1_d[1]);
    reg_simple Xcell1(regA[1],regA_[1],X2_d,Pa1_d[2],Pa1_d[3]);
    bit_to_dual Xcell2(regA[1],X8_dd,Pa2_d[0],Pa2_d[1]);
    bit_to_dual Xcell3(regA[1],X8_dd,Pa2_d[2],Pa2_d[3]);
    nor2 Xcell4(X8_c,RESET,Pa2_c);
    Q_ elem Xcell5(X8_c,X8_dd,Pa1_cX0_d);
    Q_ elem Xcell6(X0_d,X2_d,X1_d);

endmodule
```

NET LIST OF PROCESS A

FIG.21

CIRCUIT DIAGRAM OF PROCESS A reg-simple CONNECTION DIAGRAM bit-to-dual CONNECTION DIAGRAM Q_elem CONNECTION DIAGRAM Q_elem SEQUENCE C_elem CONNECTION DIAGRAM

```
module M(.. , P,.. )
..........
cport passive output[7:0] P;
..........
if(probe(P)==1' b1)
..........
  send(P,a);
..........
``` probe USAGE EXAMPLE 1

FIG.28

```
module M(.. , P_ctrl, P_data,.. )
..........
input P_ctrl;
output[7:0] P_data;
..........
if(P_ctrl==1' b1)
..........
begin
wait(P_ctrl==1' bz);
force P_data=a;
wait(P_ctrl==1' bz);
release P_data;
end;
..........
```

Verilog CODE CONVERSION EXAMPLE 1

FIG.29

```
module M(.. , P, .. )
..........
cport passive input[7:0] P;
..........
wait(probe(P)!=8' bz)
case(probe(P))
8' b00000000: .......... ;
8' b00000001: .......... ;
..........
endcase;
..........
receive(P,a);
..........
``` probe USAGE EXAMPLE 2

FIG.32

```
module M(.. , P_ctrl, P_data, .. )
..........
input [7:0] P_data;
output P_ctrl;
..........
wait(P_data!=8' bz);
case(P_data)
8' b00000000: .......... ;
8' b00000001: .......... ;
..........
endcase
..........
 begin
wait(P_data!=8' bz);
a=P_data;
force P_ctrl=1' b1
wait(P_data!=8' bz)
release P_ctrl;
end;
..........
```

Verilog CODE CONVERSION EXAMPLE 2

FIG.33

```
module M(.. , P,.. )
..........
cport passive sync P;
..........
sync(P);
..........
``` sync USAGE EXAMPLE 1

FIG.36

```
module M(.. , P_ctrl, P_data,.. )
..........
input P_ctrl;
output P_data;
..........
begin
wait(P_ ctrl !==1' bz);
force P_data=1' b1
wait(P_ ctrl==8' bz);
release P_data;
end;
..........
```

Verilog CODE CONVERSION EXAMPLE 1

FIG.37

```
module M(.. , P,.. )
.........
cport active sync P;
.........
if(probe(P)==1' b1)
.........
sync(P);
.........
``` sync USAGE EXAMPLE 2

FIG.40

```
module M(.. , P_ctrl, P_data,.. )
.........
output P_ctrl;
input P_data;
.........
if(P_ctrl==1' b1)
.........
begin
force P_ctrl=1' b1;
wait(P_ data!==1' bz);
release P_ctrl;
wait(P_ data!==1' bz);
end;
.........
```

Verilog CODE CONVERSION EXAMPLE 2

FIG.41

ASYNCHRONOUS CIRCUIT DESIGN TOOL AND COMPUTER PROGRAM PRODUCT

BACKGROUND

The present invention relates to an asynchronous circuit description language and the computer program product that enables those engineers who are well versed in hardware description languages (HDLs) to capture, verify and synthesize asynchronous circuit designs.

Along a phenomenal increase in the scale of circuits enabled by the rapid progress of technology, text-base techniques for capturing, verifying and synthesizing circuit designs by using HDLs have come in common. The phenomenal increase in the scale of circuit was instrumental in spreading the synchronous design technique, wherein all circuits are driven by a global clock, as a standard technique in a very short term. The CAE/CAD tools, SSI and MSI parts, cell libraries, and the like are all prepared almost only for synchronous designs. However, recently the clock skew problem came up along with deep sub-micron technologies, large-area VLSI chips and increasing clock frequencies. Through the scaling down of deep sub-micron technologies, wire delay is getting relatively larger while switching delay is getting smaller. As a result, the delays of the clock signal arrivals at the elements deviate widely depending on the traveling distances of the clock wires between the clock driver and the elements, so that the integrity of input/output signals of elements driven by the deviating global signal can not be guaranteed any longer. In addition to the problem of clock skew, increasing power consumption is also becoming a large problem. Exponentially increasing power consumption of VLSI, which is caused by high-speed switching and increasing scale of circuit integration, has become a major problem. And furthermore, radiation noise coherent with clocking is a problem. As a technique of solving such problems as clock skew, increasing power consumption and radiation noise, asynchronous design has come into matter of attention.

SUMMARY

In designing an asynchronous circuit, there are two methods, i.e., schematic design and text-base design. In schematic design, circuits are structurally and hierarchically captured in schematic diagrams by using graphical-user-interface (GUI)-equipped CAD tools. On the other hand, in text-base design, circuits are captured or described by using HDLs to further proceed to verification and compilation. The former method is intuitive and suitable for the smaller scale, but not suitable for the larger scale of circuit design. It is especially unrealistic according to the fact that the scale of integrated circuit is still exponentially increasing. That scale of designs fundamentally and unavoidably requires validation against specifications, functional verification, formal verification following design changes, co-simulation with software and multi-level simulation with circuit blocks and the stimulus. For the latter method, CSP, OCCAM, Tangram and the like are available as asynchronous design language. CSP, which was developed by Hoare in an effort to add parallelism to the traditional sequential programming languages, was used by Alain Martin and his team at the California Institute of Technology as a VLSI programming language. It was also the basis of OCCAM, a language suitable for programming networks of microprocessors such as Transputer. Eric Brunvand and his team at the University of Utah used OCCAM for designing asynchronous circuits. Tangram has been developed at Philips Research Institute. It is based on Hoare's CSP and includes Dijkstra's guarded-command language. Logic synthesis is performed by means of Syntax-directed Translation. The translation of the VLSI programming language into handshake circuits is highly transparent, which allows the VLSI programmer to infer cost and performance of the compiled circuit fairly directly from his Tangram program. Since the design languages and the synthesis tools have not been made commercially available, limited number of engineers at research institutes or universities can fully use them to design asynchronous circuits. Up to the present, no industrial standard of the VLSI programming language has been published yet.

Now, the problem to be resolved by the present invention is to provide asynchronous circuit design tools and computer program products which enables those engineers who are well versed in hardware description languages for synchronous circuit design, which are widely used in the industry, to design asynchronous circuits with relative ease.

To resolve the above-mentioned problem, asynchronous circuit design tools according to an aspect of the invention include a translator for transforming a code written in an asynchronous circuit design language, which is based on the subset of a standard HDL and includes minimal primitives used for describing the communications between asynchronous circuit blocks or processes, into a code written in a standard HDL that is originally developed for synchronous circuit design. The codes transformed into the standard HDL can be functionally verified by using commercially available simulators, which are originally developed for verifying synchronous circuit designs.

The asynchronous circuit design tools of the present invention include a dedicated simulator for functional verification of asynchronous circuit designs written in the asynchronous circuit design language, which is based on the subset of a standard HDL and includes minimal primitives used for describing the communications between asynchronous circuit blocks or processes. The dedicated simulator proceeds with functional simulation of asynchronous circuit designs written in the asynchronous circuit design language even without translating the code into a code written in a standard HDL for synchronous circuit design.

The dedicated simulator that is included in the asynchronous circuit design tools of the present invention can be either an interpreter, which executes source code directly instead of pre-compiling the source code into the intermediate object code, or the pre-compilation simulator, which executes the object code pre-compiled from the source code. The pre-compilation simulator is apparently better in performance for the larger scale circuit designs, while the interpreter is better in interactively debugging the smaller scale circuit designs.

The asynchronous circuit design tools of the present invention include a logic synthesis tool that translates a code written in the asynchronous circuit design language, which is based on the subset of a standard HDL and includes minimal primitives used for describing the communications between asynchronous circuit blocks or processes, into a gate level implementation or netlist, which gives information for connecting elements; cells and leaves to constitute the target circuit.

The logic synthesis tool included in the asynchronous circuit design tools of the present invention is preferably provided with a cell library that contains geographic and electric information of cells for both synchronous and asynchronous circuit synthesis. The logic synthesis means generates a gate level implementation or netlist by referring to the cell library. Simply by adding the cells for asynchronous circuit synthesis to the cells for synchronous circuit synthesis, the cell library necessary for netlist generation can be constructed.

The asynchronous circuit design language of the present invention preferably includes cport and channel as data types for communications between processes. cport preferably has the attributes active/passive and input/output. For example, a statement cport active input [7:0] A;

declares that A is a communication port that actively inputs an 8-bit data from its counterpart.

Further, a statement channel [7:0] T;

declares that T is an 8-bit wide channel, which connects cports declared somewhere in sub-processes.

In the asynchronous circuit design language of the present invention, as commands for communications between processes, it is preferable to include send, receive, sync and probe. A command statement with an active port activates a sequence of 4-phase or 2-phase handshaking by asserting a request signal. A command statement with a passive port responds by asserting an acknowledge signal.

Statements
send (A,x);
receive (B,y);

mean that data of variable x is sent through cport A, and data received at cport B is put into variable y.

sync is just for synchronization with no data transfer.

A statement sync (Z)

means that a sequence of handshaking for synchronization through cport Z takes place.

probe is a function that returns an immediate value as of request signal on a channel connected to a cport, which is put through active cport by the counterpart.

For example, in statements below cport passive output [7:0] A;
. . .
If (probe (A)=1'b1) send (A,x);
. . .

only when the immediate value on the channel connected to cport A, which is returned by the function probe, is 1'b1, the 8-bit value stored in variable x is sent as of acknowledge signal through passive cport A. When the immediate value is not 1'b1 yet, preparatory to the send command, alternative statements following the if statement can be executed.

The computer program product of the present invention is a recording medium that contains a computer program, which enables a computer system to function as transformation means to transform a code written in the asynchronous circuit design language, which includes primitives used for describing the communications between asynchronous circuit blocks or processes, into a code written in a HDL that is developed originally for synchronous circuit design. The codes transformed into the standard HDL can be functionally verified by using commercially available simulators, which are originally developed for verifying synchronous circuit designs.

The computer program product of the present invention is a recording medium, which contains a computer program that enables a computer system to function as simulation means to perform functional verification of asynchronous circuit designs written in the asynchronous circuit design language, which is based on a standard HDL and includes minimal primitives used for describing the communications between asynchronous circuit blocks or processes. The dedicated simulator proceeds with functional simulation of asynchronous circuit designs written in the asynchronous circuit design language even without translating the code into a code written in a standard HDL for synchronous circuit design.

The computer program product of the present invention is a recording medium, which contains a computer program that enables a computer system to function as simulation means to pre-compile a code written in the asynchronous circuit design language, which includes minimal primitives for communications between asynchronous circuit blocks or processes, into a code written in an intermediate language that is directly executed inside the software. For the larger scale circuit designs, the pre-compilation is better in performance.

The computer program product of the present invention is a recording medium that contains a computer program, which enables a computer system to function as simulation means to perform functional verification by interpreting a code written in an asynchronous circuit design language, which is based on the subset of a standard HDL and includes minimal primitives used for describing the communications between asynchronous circuit blocks or processes. For the smaller scale circuit designs, the interpreter is better for the sake of statement-by-statement debugging.

The computer program product of the present invention is a recording medium that contains a computer program, which enables a computer system to function as logic synthesis means for translating a code written in the asynchronous circuit design language, which is based on the subset of a standard HDL and includes minimal primitives used for describing the communications between asynchronous circuit blocks or processes, into a gate level implementation or netlist, which gives information for connecting elements: cells and leaves to constitute the target circuit.

In the computer program product of the present invention, it is preferable to include probe function as a primitive to enable processes to execute the alternative statements prior to entering a handshake sequence for acknowledging requests through passive ports.

In the computer program product of the present invention, it is preferable to include sync command as a primitive for synchronization between processes through cports.

In such recording media, for example, semiconductor memory elements (ROM, RAM, EEPROM and the like), magnetic recording media (recording media capable of reading data magnetically such as the flexible disk, and magnetic card), optical recording media (recording media capable of reading data such as CD-RAM, CD-ROM, DVD-RAM, DVD-ROM, DVD-R, PD disk, MD disk, and MO disk) are suitable. There are no particular limitations on the recording method of information into these recording media.

BRIEF DESCRIPTION OF THE DRAWINGS

FIG. 5 is a diagram showing combinations of cport attributes;

FIG. 6 is a diagram of cport attributes and channel signals;

FIG. 7 is a diagram of dual-rail encoding;

FIG. 10 is an asynchronous design description of process A;

FIG. 11 is an asynchronous design description of process B;

FIG. 12 is an asynchronous design description of process C;

FIG. 13 is a diagram of a translator;

FIG. 14 is a diagram of a dedicated simulator;

FIG. 15 is an example of a Verilog code of process A;

FIG. 16 is an asynchronous design description of a handshake circuit;

FIG. 17 is an example of the Verilog code of the handshake circuit;

FIG. 18 is a translation scheme of dual-rail encoding;

FIG. 19 is a diagram of a dual-rail encoder/decoder;

FIG. 20 is a diagram of a logic synthesis tool;

FIG. 21 is a netlist of process A;

FIG. 28 is an asynchronous circuit design code using the probe command;

FIG. 29 is an example of Verilog HDL;

FIG. 32 is an asynchronous circuit design code using the probe command;

FIG. 33 is a coding example of the Verilog code;

FIG. 36 is an asynchronous circuit design code using the sync command;

FIG. 37 is a coding example of the Verilog code;

FIG. 40 is an asynchronous circuit design code using the sync command; and

FIG. 41 is a coding example of the Verilog code.

DETAILED DESCRIPTION OF EMBODIMENTS

Preferred embodiments of the present invention are described below with references to the drawings.

Figure 1:
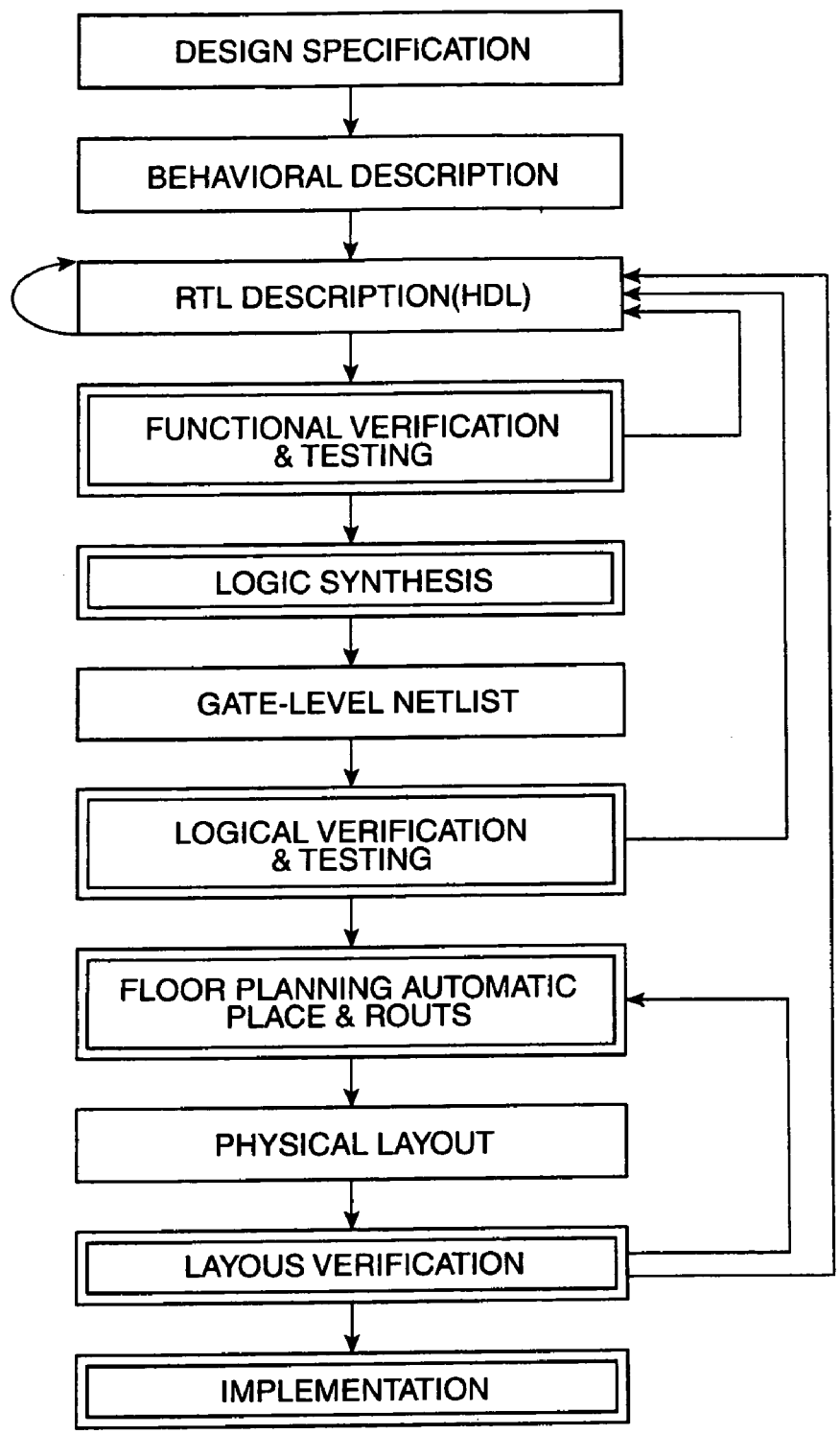
FIG. 1 is a typical circuit design flow using an industry standard Verilog HDL.

FIG. 1 shows a typical circuit design flow for designing VLSI IC circuits using an industry standard Verilog HDL. Single-framed blocks stand for the level of design representation; double-framed blocks stand for design processes. "Design Specifications" describe abstractly the functionality, interface, and overall architecture of the digital circuit to de designed. At this point, the architects do not need to think about how they will implement this circuit. The specifications are described by using intuitive and natural languages, notations, tables and drawings. A "Behavioral Description" is then created to analyze the design in terms of functionality, performance, compliance to standards, and other high-level issues. The "Behavioral Description" written in Verilog HDL is to be validated by using Verilog simulators in terms of consistency with the "Design Specifications".

The "Behavioral Description" is manually converted to an "RTL description" in Verilog HDL. The designer has to describe the data flow that will implement the desired digital circuit. In that sense, the "RTL Description" is dependent on architecture, while "Behavioral Description" is independent of architecture. From this point onward, the design process is done with the assistance of computer-aided design (CAD) tools. Although "Behavioral Description" is not subject to logic synthesis, "RTL Description" is used for logic synthesis. "Behavioral Description" is subjected to simulation for both verifying "Design Specification" and generating test vectors for "Functional Verification and Testing" by using the "RTL Description". "Gate-level Netlist", which is an output of "Logic Synthesis", is subjected to "Functional Verification & Testing" with a cell library. "Gate-level Netlist" verified by "Functional Verification & Testing" is input to "Floor Planning Automatic Place & Route" to generate the "Physical Layout". "Layout Verification" verifies the "Physical Layout". Finally the stream data of the "Physical Layout" passes to the "Implementation" or chip fabrication.

Figure 2:
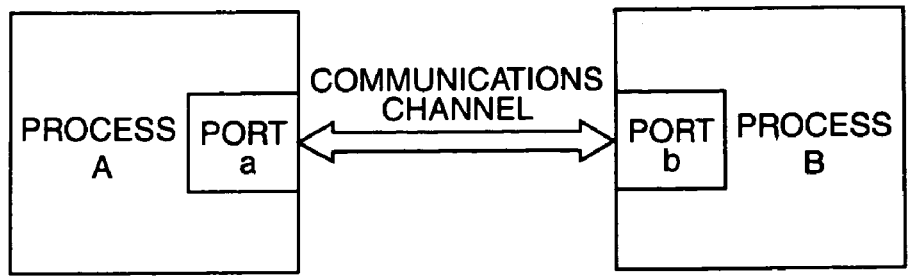
FIG. 2 is a diagram showing communications between processes in an asynchronous circuit.

FIG. 2 shows two circuit blocks or processes, which constitute an asynchronous circuit, communicating with each other through handshake communications. An asynchronous circuit is defined as a circuit that is not driven by a global clock, which operations are sequenced through handshaking protocols. The circuit is a collection of components that pass data among each other. A component is idle until invoked; Computation is demand-driven. Since the circuit is not driven by a global clock, the components are self-timed. In synchronous design, since a global clock drives operations: instruction fetch, decode, execution and write back, clock related problems such as clock delay, clock skew, and clock jitter become major when the designer wants to make the circuit run as fast as possible by shortening the clock period or increasing the clock frequency. However, in asynchronous design, a self-timed circuit block or process operates either actively or passively through communications by handshaking, so that such problems do not occur. Each process is connected to the other processes by channels through the ports. The local operations are sequenced and driven either by itself actively or by others passively through handshaking protocols. A channel connects processes at the ports. In an example shown herein, process "A" has port "a", and process "B" has port "b". Process "A" and process "B" are connected at port "a" and port "b" by a channel. The channel is constituted by a request signal, an acknowledge signal, and a data signal. Processes can proceed to the operations as quick as possible when the predefined conditions to initiate the operations are satisfied.

Figure 3:
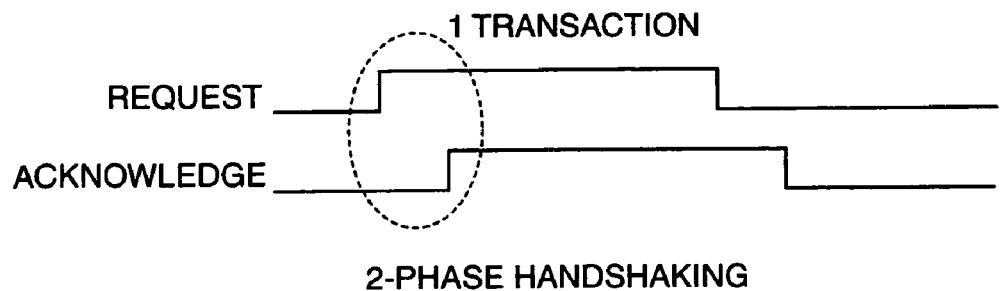
FIG. 3 is a diagram showing a 2-phase handshake between processes.

FIG. 3 shows the 2-phase handshaking protocol, by non-return-to-zero (NRZ) signaling, wherein, at either the rising edges or the falling edges of a signal, a request/acknowledge is transmitted and received by the counterpart. For instance, in the above example shown in FIG. 2, to transmit a request signal from port "a" to port "b", REQUEST is raised from low (L) level to high (H) level or dropped from H level to L level. Port "b", by detecting either rising or falling edge of REQUEST, accepts that the request signal from port "a" has arrived. For acknowledging the request signal, ACKNOWLEDGE shall be either raised from L level to H level or dropped from H level to L level. This sequence completes the protocol of the 2-phase handshaking.

Figure 4:
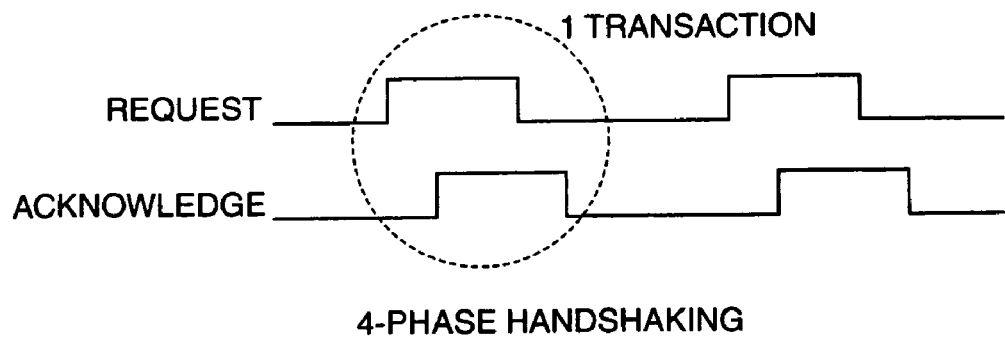
FIG. 4 is a diagram showing a 4-phase handshake between processes.

FIG. 4 shows 4-phase handshaking protocol between processes by return-to-zero (RTZ) signaling. The request/acknowledge signal is transmitted and received by the counterpart in RTZ. For instance, in the above example shown in FIG. 2, to transmit a request signal from port "a" to port "b", REQUEST is raised from L level to H level. Port b, by detecting H level of REQUEST, accepts that the request signal has arrived. For acknowledging the request signal, ACKNOWLEDGE shall be raised from L level to H level. Port "a", which has ascertained that the acknowledge signal has arrived, negates the request signal: port "a" drops REQUEST from H level to L level. The port "b", which has ascertained that the request signal has been negated, negates the acknowledge signal: port "b" drops ACKNOWLEDGE from H level to L level, and completes the sequence of handshake. Just for the sake of clearness, the 4-phase handshaking is adopted hereinafter in the description.

Figure 8:
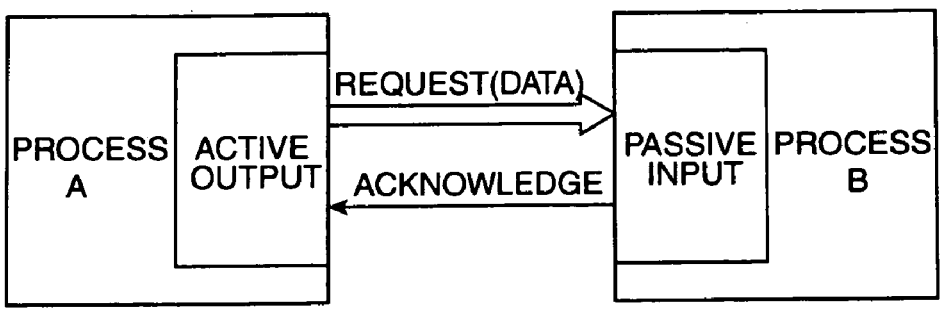
FIG. 8 is a diagram of dual-rail encoding.

FIG. 5 shows combinations of attributes of ports. Since process either actively or passively operates, all ports are endowed with 'Active' or 'Passive' of the attribute category 1. Further, when 'Input' or 'Output' of the attribute category 2 is taken into consideration, a total of four types of ports are classified by the attributes. The attribute of the counterpart is uniquely determined as shown in FIG. 5. For example, as shown in FIG. 6, since the port attribute of process "A", which is schemed to actively receive data, is 'Active Input,' the port attribute of the counterpart process B, which is to passively send out data, shall be 'Passive Output.' Signaling of the communications channel can be either the above mentioned 2-phase or 4-phase handshaking. In this case, if the dual-rail encoding scheme is used, as shown in FIG. 7, ACKNOWLEDGE can be merged with DATA. If, as shown in FIG. 8, wherein the port attribute of the process A is 'Active Output', since REQUEST and DATA are both of the same direction, REQUEST and DATA are to be merged. In asynchronous design, use of dual-rail encoding scheme in designing the control and the datapath part gets rid of delay element so that the circuit can be Delay Insensitive. The present invention is able to handle both the bundle data scheme shown in FIG. 6 and the dual-rail encoding scheme shown in FIG. 8.

Figure 9:
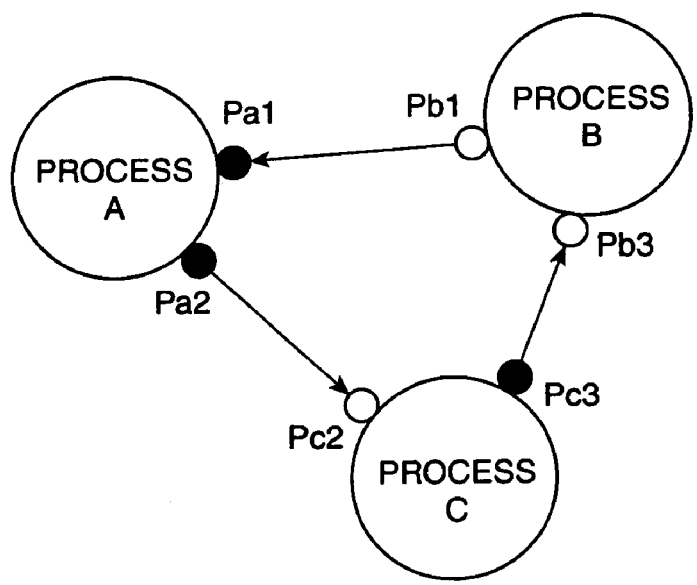
FIG. 9 is a diagram of a handshake circuit.

FIG. 9 shows three processes connecting with each other through channels at ports. Each process has a plurality of ports to be capable to communicate with a plurality of processes. In the handshake circuit shown herein, process A, while communicating to process B, communicates with process C. Although process A has Active ports as depicted by a black dot, process B has Passive ports, as depicted by a white dot, against to the ports of processes A and C. Process C has a Passive port against to process A and an Active port against to process B. Focusing on process A, since the attribute of port Pa1 is Active Input, the handshake protocol for receiving data from the counterpart process B is initiated by sending out the request signal through the port, as shown in FIG. 7. On the other hand, since the attribute port Pa2 is Active Output, the handshake protocol for transmitting data to the counterpart process C is initiated by sending out the request signal merged with data itself, as shown in FIG. 8.

In the present invention, minimal primitives just for describing above explained communications between asynchronous processes are added to the subset of a HDL such as Verilog HDL. FIG. 10 shows an example of code that is written in the asynchronous circuit design language of the present invention, wherein the constitutional entities and the attributes of process A shown in FIG. 9 is captured using the primitives: data types, commands and attributes. The coding example shown in FIG. 10 is explained hereinafter along the grammar. Module name "A" is first given, and the input/output signals "RESET,Pa1,Pa2" are declared. Inside the scope of the module, a 2-bit variable "regA" is declared. In the declaration of cport, which is a primitive newly introduced to the asynchronous circuit design language of the present invention, port "Pa1" and "Pa2" and the attribute are declared. The attribute of port Pa1 and Pa2 are Active Input and Active Output respectively as shown in FIG. 9. Receiving data from process B is carried out by the receive command, and transmitting data to process C is carried out by the send command. The receive command and the send command are the commands newly introduced by the asynchronous circuit design language of the present invention. Since the always statement is blocked by the wait command for RESET, upon RESET negated, the sequence of data transmission from process B is initiated by the receive command. After the data from process B is received through port Pa1, the data is stored into variable regA. The data stored in regA is to be transmitted to process C through Pa2 by the send command. Processes B and C shown in FIG. 9 are coded as shown in FIG. 11 and FIG. 12 respectively.

FIG. 13 is the functional block diagram of asynchronous circuit design tools 100 of the present invention. The asynchronous circuit design tools 100 is equipped with a translator 10. The translator 10 is provided with transformation means 11 for transforming a code 40 written in an asynchronous circuit design language, which is based on the subset or fullest of an HDL such as Verilog HDL (or VHDL) and includes minimal primitives for describing communications between asynchronous circuit blocks or processes, into a code written in an HDL such as Verilog HDL (or VHDL) 50. By transforming the code 40 to the code 50 written in HDL originally developed for the synchronous circuit design, it is enabled to verify a circuit design written in the asynchronous circuit design language by using a commercially available simulator mainly used for synchronous circuit design. The translator 10 is realized by a computer program, which makes a computer system to function as the transformation means 11.

FIG. 15 shows an example of Verilog code transformed from the code written in the asynchronous circuit design language, which is shown in FIG. 10. Even though the Verilog code hereof is transformed from the code written in the asynchronous circuit design language that corresponds to the circuit of dual-rail scheme as shown in FIG. 7, it is apparently not a circuit of dual-rail encoding scheme, but transformed to a circuit of signal-rail scheme with the null state of high impedance; high impedance substitutes for null of dual-rail-encoding scheme. For the sake of functional verification by using a commercial Verilog simulator, such a transformation is perspective and consistent with the original code written in the asynchronous circuit design language. Namely, the Verilog code is not used for logic synthesis afterward, but only for simulation verification. The actual circuit is implemented by using dual-rail encoding scheme. The list of input/output signals "RESET, Pa1_req", Pa1_data, Pa2_data, Pa2_ack" following Module name "A" is first generated. {Pa1_req, Pa1_data} and {Pa2_data, Pa2_ack} correspond to Pa1 and Pa2 in FIG. 10 respectively. In the scope of module A, a 2-bit variable "regA" is declared. "RESET" is declared as an input signal. "Pa1_req", "Pa1_data", "Pa2_data", "Pa2_ack" are declared as a 1-bit output, a 2-bit input, a 2-bit output and a 1-bit input respectively. As already mentioned, 4-phase handshaking is employed in the present embodiment, hence hereinafter, the body of the Verilog code in FIG. 15 is explained statement by statement, with reference to FIGS. 4, 7, 8 and 9.

The first begin-end block of the Verilog code follows the protocol of 4-phase handshaking described in FIGS. 4 and 7. REQUEST is first asserted by force statement with Pa1_req. ACKNOWLEDGE and DATA are merged as Pa1_data in the wait statement. Namely the counterpart puts the data on Pa1_data for both acknowledging REQUEST and sending out DATA. High impedance of Pa1_data stands for null so that the wait statement is blocking the sequence of 4-phase handshaking protocol, waiting for DATA arrival at Pa1_data. Upon DATA arrival at Pa1_data, DATA is stored into the variable reg A and REQUEST on Pa1_req is negated for concluding the sequence of 4-phase handshaking. At the end of the first begin-end block, the wait statement with Pa1_data is blocking the sequence for ensuring that the counterpart acknowledges the negation of REQUEST on Pa1_req.

The second begin-end block follows the sequence of 4-phase handshaking described in FIGS. 4 and 8. REQUEST and DATA are merged as Pa2_data in the force statement. The data stored in variable regA is first put on Pa2_data as REQUEST and DATA. Wait statement with Pa2_ack is blocking the sequence by waiting for the acknowledgement of REQUEST by the counterpart. Upon the acknowledgement of REQUEST by assertion of 1'b1 on Pa2_ack by the counterpart, REQUEST on Pa2_data is negated for concluding the sequence. At the bottom of the begin-end block, the wait statement with Pa2_ack is blocking the sequence just for ensuring that the counterpart acknowledges the negation of REQUEST on Pa2_data.

FIG. 16 shows an example of code written in the asynchronous circuit design language, which describes the top level of the handshake circuit of FIG. 9 constituted by processes A, B, and C. The processes are above explained with FIGS. 4, 7, 8, 10; 11 and 12. Following module statement, CH1, CH2, and CH3 are declared as 2-bit wide channels. channel is newly introduced by the asynchronous circuit design language of the present invention. As the list of arguments displays, the channels connect the modules as FIG. 9 shows. The Verilog code transformed from the above code written in the asynchronous circuit design language by the translator 10 shown in FIG. 13 is shown in FIG. 17. As shown in the Verilog code hereof, a channel CH (n=1, 2, 3) of FIG. 16 is substituted by two wires; CHn_ctrl and CHn_data (n=1, 2, 3). Namely CHn={CHn_ctrl, CHn_data} (n=1, 2, 3). Port Pa1_req of process A is connected to wire CH1_ctrl and port Pa1_data is connected to wire CH1_data. Likewise, port Pc3_ack of process C is connected to wire CH3_ctr and port Pc3_data is connected to wire CH3_data.

In the above explanation, the code written in the asynchronous circuit design language is transformed by the translator to the code written in Verilog HDL, which is verified by using the commercially available simulator originally developed for synchronous circuit. However, as shown in FIG. 14, the code 40 written in the asynchronous circuit design language, which is based on the subset or fullest of Verilog HDL and includes minimal primitives for describing communications between asynchronous circuit blocks or processes, can be fed directly to the dedicated simulator 20 that is a verification means 21 of the asynchronous circuit design tools 100. As the verification means 21, two kinds of simulator are presented as preferable embodiments. The dedicated simulator can be either an interpreter, which executes source code directly instead of pre-compiling the source code into the intermediate object code, or the pre-compilation simulator, which executes the object code pre-compiled from the source code. The pre-compilation simulator is apparently better in performance for the larger scale circuit designs, while the interpreter is better in interactively debugging the smaller scale circuit designs.

The dedicated simulator 20 is realized by a computer program that makes a computer system to function as the verification means 21.

The code written in the asynchronous circuit design language is transformed to a netlist which is generated by the logic synthesis tool 30 shown in FIG. 20 of the present invention. As above explained, the Verilog code of process A generated by translator 10 can be hardly synthesized, because detection of high impedance of signal lines is not practical for the implementation. The logic synthesis tool 30 of the present invention is explained, hereinafter, with the dual-rail encoding scheme. FIG. 18 is presented as an example of the dual-rail encoding scheme. FIG. 19 is a schematic diagram of 4-bit datapath by using the dual-rail coding scheme. It is assumed that element and wire delays vary. During signal Send is low (L), all the output of the encoder are driven to {0,0} or null, which means that no data is sent out. After it is ensured that all the input {d3, d2, d1, d0} arrived at the encoder, signal Send is driven to high (H) for the encoder to start encoding and driving the output lines {d3.0, d3.1, d2.0, d2.1, d1.0, d1.1, d0.0, d0.1}. For example, if d0 is 1 when Send is driven to H, {d0.0, d0.1} at the end of decoder shall be driven to {0,1} with element delays of the encoder and wire delays of d0.0 and d0.1. The 1-bit decoder decodes data {d0.0, d0.1} according to the dual-rail encoding scheme shown in FIG. 18. By decoding Null, the decoder can indicates when the data arrives. The signals indicating the arrivals are input to a Muller-C element. When inputs to the Muller-C element all reach high, signal Receive becomes high to indicate the arrivals of all the 4-bit data.

The above code written in the asynchronous circuit design languages is transformed to the Verilog net list, which can be generated, by the logic synthesis tool 30, which is included in the asynchronous circuit design tools 100 as shown in FIG. 20. The logic synthesis tool 30 comprises a logic synthesis means 31 and a cell library 32, which consists of cells for both synchronous and asynchronous circuit design. The logic synthesis means transforms the code 40 written in the asynchronous circuit design language, which is based on the subset or fullest of Verilog HDL and includes minimal primitives for describing communications between asynchronous circuit blocks or processes, into a netlist 60, which includes information of all instances of cells and leaves, and the connections. The logic synthesis tool 30 generates a netlist by referring to the cell library 32. The logic synthesis tool 30 is realized by a computer program, which makes a computer system to function as the logic synthesis means 31.

Figure 22:
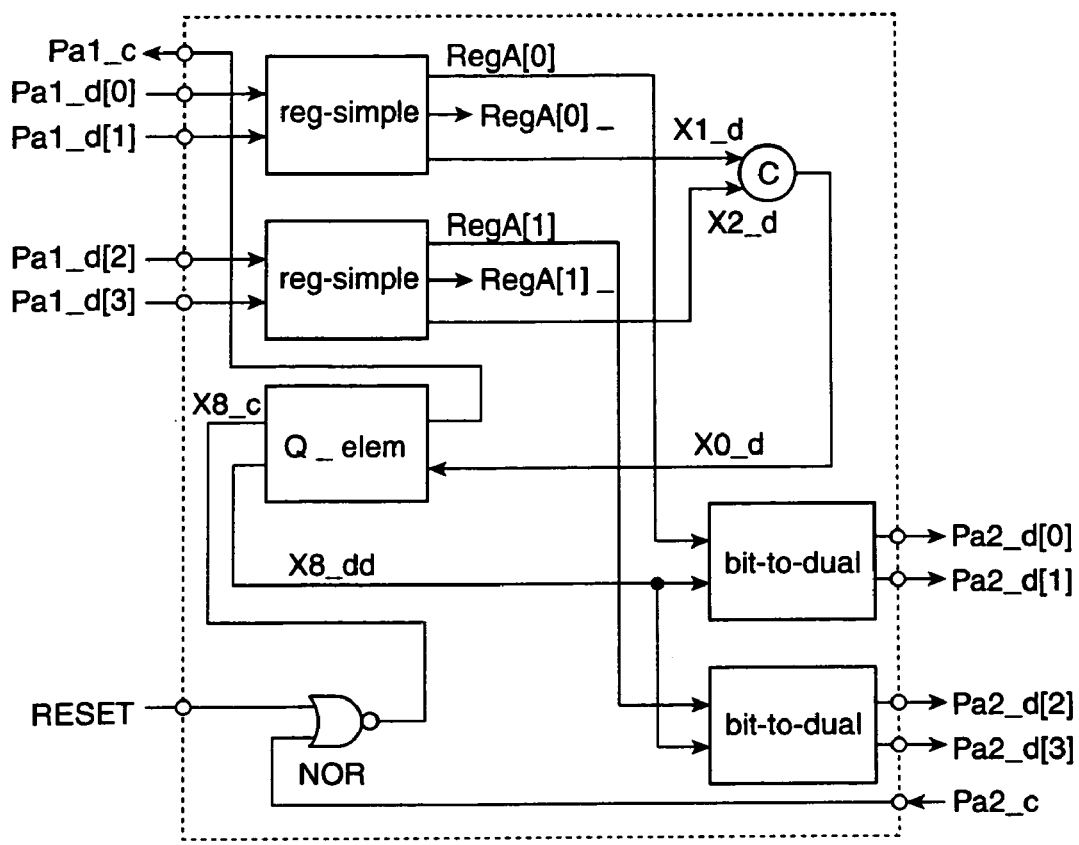
FIG. 22 is a circuit diagram of process A.

FIG. 21 is a netlist, which is transformed by the logic synthesis tool 30 from the code of process A shown in FIG. 10. The list of arguments, RESET, Pa1_c, Pa1_d, Pa2_c, Pa2_d, is generated with module statement. RESET is an input. In the scope of the module, two 2-bit variables regA and regA_ are declared for domestic use. Pa1_c and Pa2_c are declared as an output and input respectively. Pa1_d and Pa2_d are declared as a 4-bit input and output respectively. It shall be noted that a 2-bit wide cport of FIG. 10 is transformed into a 4-bit wide port in FIG. 21. Wires for domestic use inside the scope of the module are declared with wire statement. There are seven instances declared in the body of the module. There are four kinds of cells or leaves instanced. FIG. 22 shows a circuit diagram corresponding to the netlist. These cells and leaves are all included in the cell library 32 of the logic synthesis tool 30.

Figure 23:
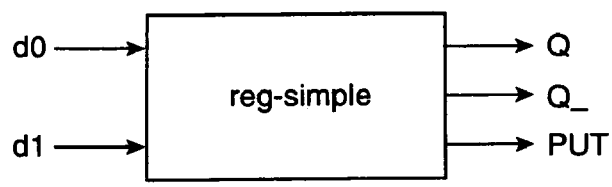
FIG. 23 is a connection diagram of reg-simple.
Figure 24:
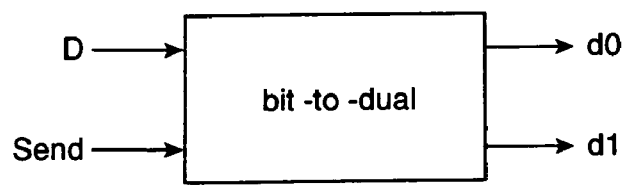
FIG. 24 is a connection diagram of bit-to-dual.
Figure 25:
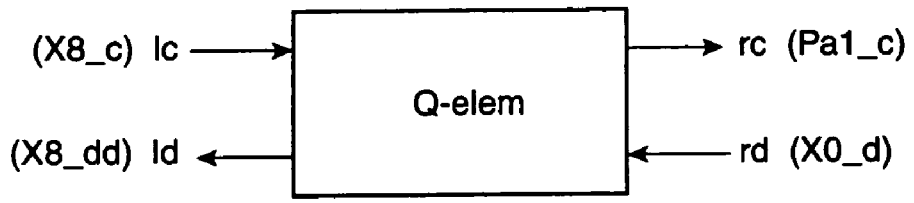
FIG. 25 is a connection diagram of Q_elem.
Figure 26:
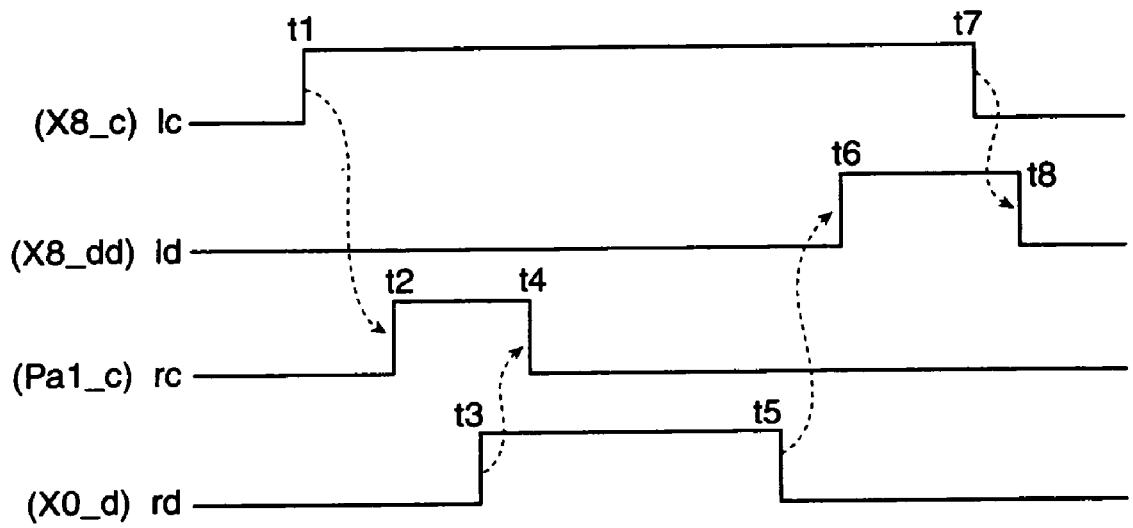
FIG. 26 is a sequence of input/output signals of Q_elem.
Figure 27:
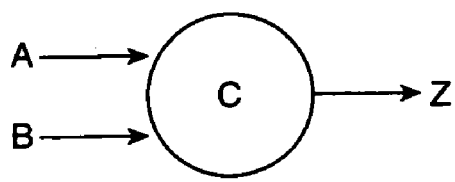
FIG. 27 is a connection diagram of Muller-C element.

FIG. 23 shows the connection diagram of reg-simple. The cell is a 1-bit dual-rail decoder, which corresponds to the decoder for 1-bit data shown in FIG. 19. Two wires d0, d1 comprise a 1-bit dual-rail input. Reg-simple decodes the input and generates the output signals Q, Q_ and PUT according to the dual-rail encoding scheme shown in FIG. 18. The data that is decoded and outputted to Q and Q_ is also stored inside the cell for future use. When incoming data is decoded and outputted, PUT, which is an output signal indicating the arrival of data, becomes true or high. FIG. 24 shows the connection diagram of bit-to-dual, which corresponds to the 1-bit encoder shown in FIG. 19. When Send becomes true or high, 1-bit data D is subjected to dual-rail encoding. The encoded data is outputted to d0, d1. Namely 1-bit data D is transformed to {d0, d1} according to the dual-rail encoding scheme shown in FIG. 18. FIG. 25 shows the connection diagram of Q_elem. Q_elem controls the sequence of the 4-phase handshaking protocol shown in FIG. 26. FIG. 27 shows the connection diagram of 2-input Muller-C element. Muller-C element is used for rendezvous of a plurality of input signals. Muller-C element is not a combinational circuit, but a sequential circuit, which maintains the state with unmatched inputs and changes the state with matched or coincident inputs. When both A and B are high, the state and Z become true or high, whereas when both A and B are false or low, the state and Z become false or low. In other cases, the state and Z does not change.

Using the knowledge above explained, the schematic diagram of process A shown in FIG. 22 can be clearly explained. Inside the dotted line is the schematic diagram generated by the logic synthesis tool 30, which corresponds to the netlist shown in FIG. 21. Circles on the dotted line indicate that corresponding signals are listed as input/output ports in FIG. 21. Although RESET is not explicitly declared in the code written in the asynchronous circuit design language of this invention shown in FIG. 10, but declared in the synthesized netlist shown in FIG. 21 and the schematic diagram in FIG. 22 for initializing the circuit.

Since RESET is first asserted, X8_c, which connects to 1c of Q_ element, is initially driven to low true by the NOR gate. When RESET is negated, since Pa2_c is also assumed low, X8_c becomes high (t1 in FIG. 26); the sequence of handshaking protocol commences at t1, as shown in FIG. 26. With a minimal delay caused by Q_elem, output of the Q_elem rc goes high (t2); Pa1_c goes high. Pa1_c is a REQUEST signal to process B (as shown in FIG. 9).

In response to the REQUEST signal, process B sends out DATA on Pa1_d[n] (n=0, 1, 2, 3), which is already dual-rail encoded by the counterpart or process B. The 2-bit data is decoded, latched inside reg-simple and outputted as regA[0] and regA[1] (regA[0]_ and regA[1]_ are negated outputs). PUT signals from two reg-simples are putted on wire x1_d and x2_d, which are inputted to a Muller-C element that recognizes receipt of the data. Due to varying lengths of the data lines x1_d and x2_d, wire delay shall be varying. x0_d of the Muller-C element becomes true or high when both x1_d and x2_d become true or high (t3). When x0_d of FIG. 22, which corresponds to rd of FIG. 26 goes to true or high, Q_ element turns rc low; Pa1_c of FIG. 22 goes to low (t4). The data sent out from the counterpart process B is now acknowledged by the negation of Pa1_c. The counterpart process B outputs Null on the data lines to acknowledge the negation of Pa1_c. The null data makes reg-simple to turn x1_d and x2_d false or low, so the Muller-C element turns x0_d false or low (t5). At this point, the sequence of handshaking protocol with the counterpart process B is completed.

x0_d or rd transition to low makes Q_elem to turn x8_dd true or high (t6); Send signal to bit-to-dual goes true. The two bit-to-duals encode the data regA[0] and regA[1] respectively stored in the two reg-simples in the dual-rail encoding scheme and sends them out onto Pa2_d[n](n=1, 2, 3); a REQUEST signal from process A to the counterpart process C (shown in FIG. 9) is asserted. The counterpart process C, in response to receipt of the REQUEST and DATA, turns Pa2_c true or high to acknowledge the REQUEST signal. When Pa2_c goes true or high, X8_c (input signal 1c of Q_elem), which the NOR output, goes false or low (t7). Q_elem, upon the transition of 1c to false or low, turns 1d false or low; X8_dd (Send of bit-to-dual as shown in FIG. 24) goes to false or low (t8). The two bit-to-duals drives the data lines Pa2_d[n] (n=0, 1, 2, 3) to low; The completion of the sequence of handshaking protocol with the counterpart process C is now declared by module A against the counterpart process C. The process C acknowledges the transition to Null by negating Pa2_c to completes the sequence of handshaking protocol with the process A. As shown in the code of FIG. 10, as far as RESET is negated, the sequence of the handshaking protocol between the processes repeats itself.

Function probe and command sync of the present invention can be used for designing efficient circuit in terms of energy, speed and area with relative ease. Before the explanation of the preferred embodiment, the primitives for describing communications between asynchronous circuit block or processes, which are added to the subset or fullset of Verilog HDL, are summarized as follows:

1. channel A newly added data type. It connects cport below.
2. cport A newly added data type. There are six types as follows:
   active input active input port
   active output active output port
   passive input passive input port
   passive output passive output port
   active sync active synchronize port
   passive sync passive synchronize port
3. send/receive/sync Newly added commands for communications
   send A command for transmitting data read from a variable
   receive A command for receiving data and writing in a variable
   sync A command for synchronization between ports without accompanying data transmission/receiving
4. probe Newly added Function
   probe Function returning an immediate value on a channel connected to a designated cport First, a working example using probe function will be described. In the sequence of handshaking protocol of send or receive command through the passive port, a transmission or reception sequence starts upon the arrival of a request signal from an opposite port. However, in an actual circuit, handshaking protocol does not necessarily start immediately upon the arrival of a request signal. For example, in some cases, the handshaking protocol of transmitting or receiving is conducted after a request signal arrives and another operation is executed. According to a newly defined command, after a request signal arrives from an opposite port and another operation is carried out, the handshaking protocol of transmitting or receiving can be carried out.

FIG. 28 shows a code example in which usage example 1 of probe function is written in an asynchronous circuit design language. In the code example, " . . . " indicates any arbitrary statement. In the module declaration, a module name "M" and an input/output signal name "P" are declared. In the input/output signal (port) declaration, the port P is declared to be an 8-bit cport passive output. The if statement describes that if a value returned by probe(P) command is 1 of 1-bit, the next statement (" . . . " between the if statement and send(P, a) command) is executed. send(P, a) command transmits a value read from a variable a through port P to an opposite port.

Figure 30:
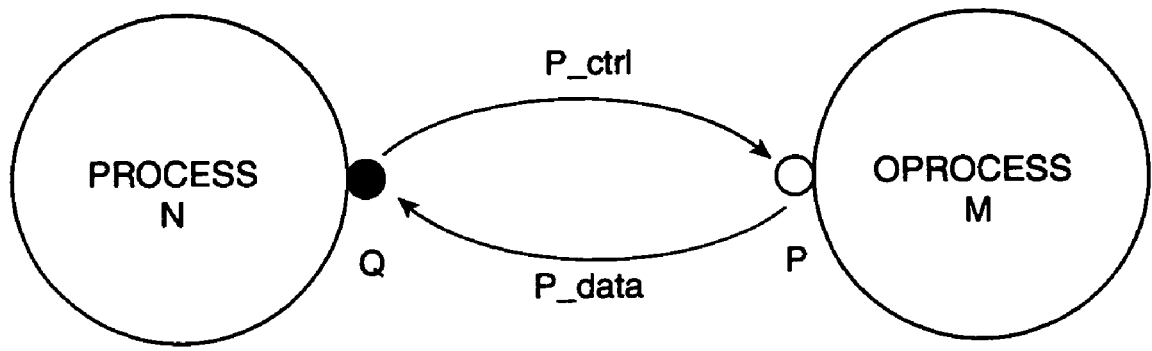
FIG. 30 is a diagram of communications between asynchronous processes.

FIG. 29 shows a Verilog code example of usage example 1 of probe command. In the module declaration, the module name "M" and an input/output signal name "P_ctrl, P_data" are declared. In the input/output declaration, a 1-bit input signal P_ctrl and an 8-bit output signal P_data are declared. FIG. 30 shows the state based on these codes. Processes M and N are connected through respective ports P and Q. The port P is passive output, while the port Q is active input. Upon receiving a request signal through P_ctrl from the port Q, the port P transmits data (acknowledge signal) through P_data.

Figure 31:
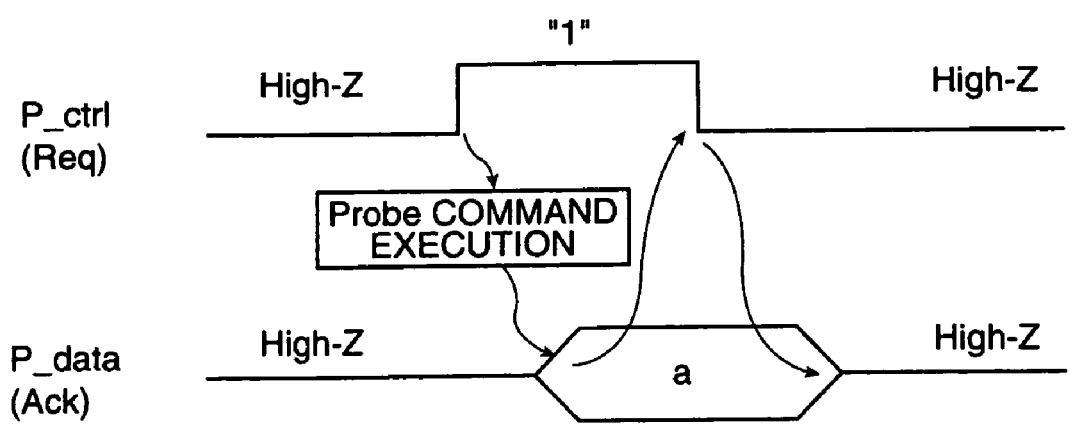
FIG. 31 is a diagram of a handshake between processes.

Referring back to FIG. 29, the if statement is coded such that if the value of P_ctrl is 1 of 1-bit, the next statement ("...") between the if statement and begin statement) is executed. The begin-end statement corresponds to a Verilog code of send(P, a) command. The begin-end statement will be described referring to FIG. 31. After waiting until P_ctrl becomes not high impedance, the probe command is executed. Then, a value of the variable a is output to P_data. Next, after waiting until P_ctrl becomes high impedance, P_data is opened (4-phase handshaking). P_ctrl corresponds to a request signal and P_data corresponds to an acknowledge signal. As described above, by using probe command, after receiving a request signal from an opposite port and before returning an acknowledge signal to the opposite port, any arbitrary statement "..." can be executed.

FIG. 32 shows a code example in which usage example 2 of probe command is written in an asynchronous circuit design language. In the module declaration, the module name "M" and the input/output signal name "P" are declared. In the input/output declaration, the port P is declared to be an 8-bit cport passive input. The wait statement describes that if a value retuned by a probe(P) command is an 8-bit predetermined value (if not high impedance), the statement "..." of a case statement determined in accordance with the value returned by the probe(P) command. receive(P, a) command assigns a value received through the port P to a variable a.

Figure 34:
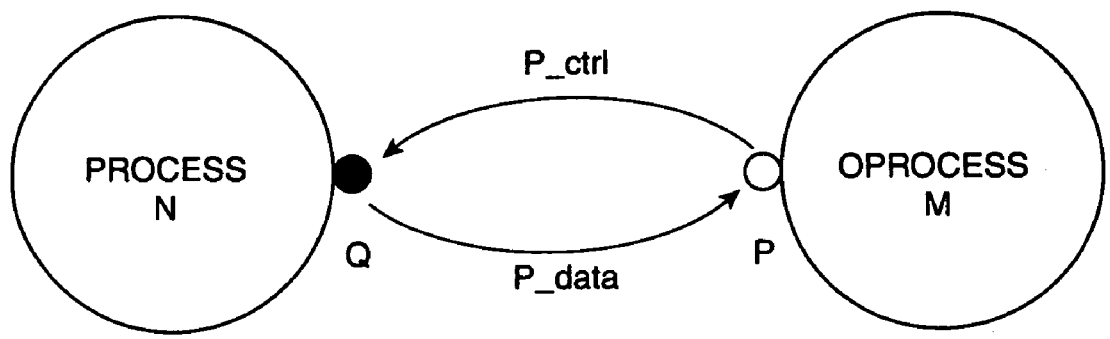
FIG. 34 is a diagram of communications between asynchronous processes.
Figure 35:
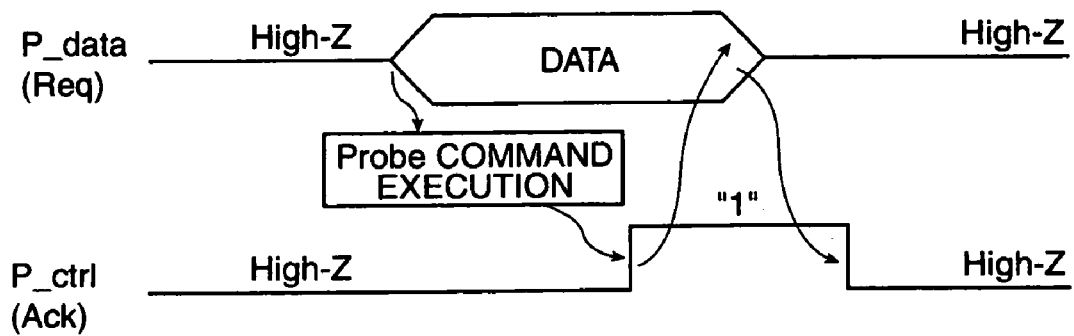
FIG. 35 is a diagram of a handshake between processes.

FIG. 33 shows a Verilog code example of usage example 2 of probe command. In the module declaration, the module name "M" and an input/output signal name "P_ctrl, P_data" are declared. In the input/output declaration, an 8-bit input signal P_data and a 1-bit output signal P_ctrl are declared. FIG. 34 shows the state based on these codes. Processes M and N are connected through respective ports P and Q. The port P is passive input and the port Q is active output. When the port P receives data (request signal) from the port Q through P_data, the acknowledge signal is returned through P_ctrl. Referring back to FIG. 33, the wait statement is coded so that if a P_data value is an 8-bit predetermined value (if not high impedance), the statement "..." of a case statement determined in accordance with the P_data value is executed. The begin-end statement is Verilog code of receive(P, a) command. The begin-end statement will be described referring to FIG. 34. After waiting until P_data becomes not high impedance, the probe command is executed. Then, a value output to P_data is assigned to the variable a. Next, 1 of 1-bit to P_ctrl is output, followed by waiting until P_data becomes high impedance. Then, P_ctrl (4-phase handshaking) is opened. P_data corresponds to a request signal and P_ctrl corresponds to an acknowledge signal. As described above, by using the probe command, after receiving a request signal from an opposite port and before returning an acknowledge signal to the opposite port, any arbitrary statement "..." designated in the case statement can be executed.

FIG. 36 shows a code example of usage example 1 of sync command that is written in an asynchronous circuit design language. In the module declaration, the module name "M" and the input/output signal name "P" are declared. In the input/output declaration, the port P is declared to be cport passive sync. By using sync(P) command, the module or process "M" synchronizes with the counterpart process through the port P.

Figure 38:
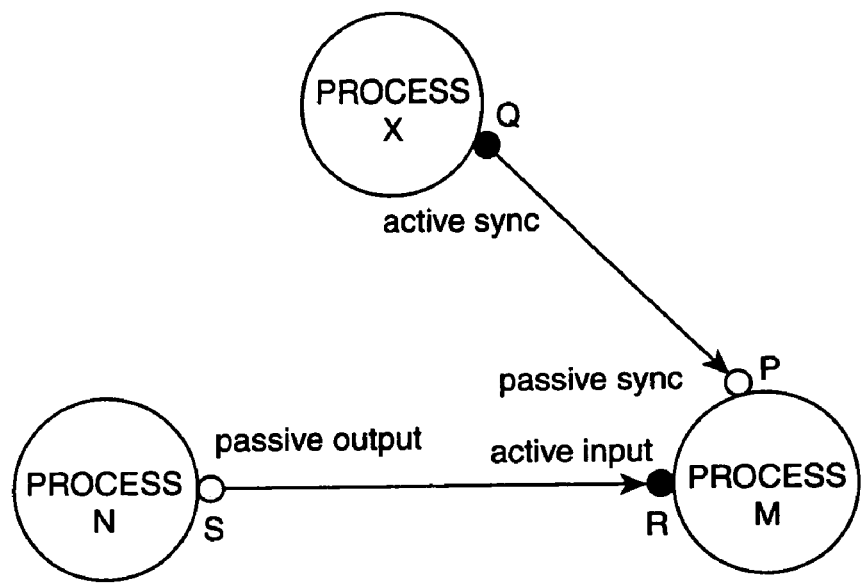
FIG. 38 is a diagram of communications between asynchronous processes.

FIG. 37 shows a Verilog code example of usage example 1 of sync command. In the module declaration, the module name "M" and the input/output signal name "P_ctrl, P_data" are declared. In the input/output declaration, an input signal P_ctrl and an output signal P_data are declared. FIG. 38 shows the state based on these codes. Processes M and X are connected through respective ports P and Q. The port P is passive sync and the port Q is active sync. Furthermore, processes M and N are connected through respective ports R and S. The port R is active input and the port S is passive output. The ports P and Q do not carry out transmission/reception but establishes synchronization between the processes. The ports R and S carry out data transmission/reception through handshaking protocol. Referring back to FIG. 37, the begin-end statement is Verilog code of sync(P) command. In this begin-end statement, after waiting until P_ctrl becomes no high impedance, 1 of 1-bit is output to P_data. Next, after waiting until P_ctrl becomes high impedance, P_data is opened. This makes it possible to establish synchronization between the ports P and Q.

Figure 39:
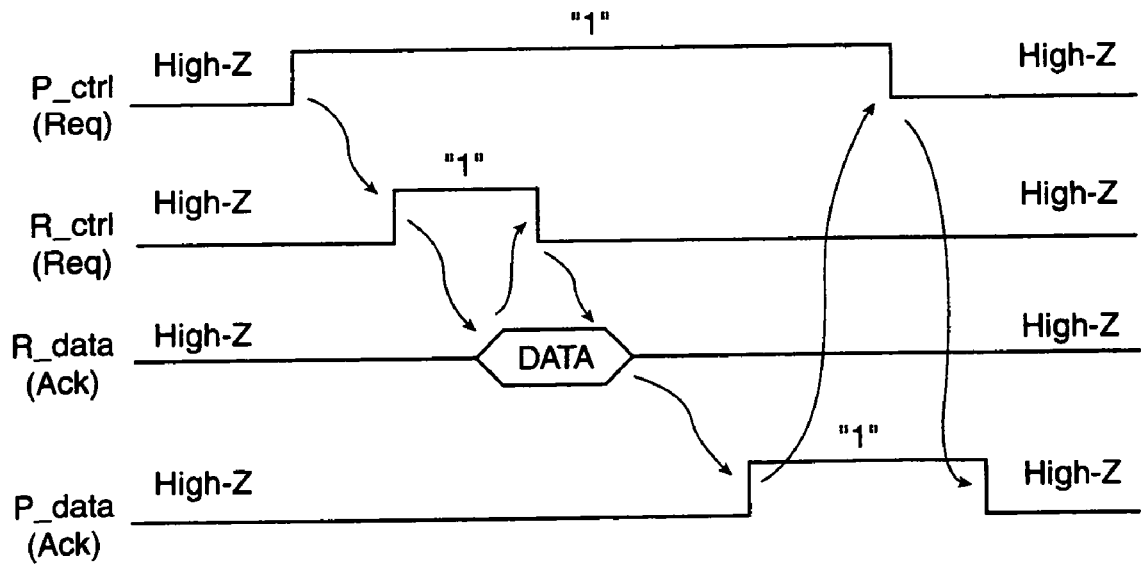
FIG. 39 is a diagram of a handshake between processes.

A usage example of sync command will be described referring to FIGS. 38 and 39. Here, procedure whereby a process X controls communications between the processes M and N through the ports P and Q will be illustrated. When P_ctrl becomes not high impedance, the process M detects the arrival of a request signal from the port Q. Then, the process M outputs to R_ctrl a request signal requesting data transfer. Thereafter, data is output from the process N to R_ctrl. The data is output to R_data from the process N. This data is the acknowledge signal to the request signal. In response to that the data is output to R_data, the process M negates R_ctrl. Upon the completion of data reception from R_ctrl, the process M outputs the acknowledge signal to R_data. Then, P_ctrl is negated. As described above, by using the sync command, it is also possible to control communications between processes.

FIG. 40 shows a code example in which usage example 2 of sync command written in an asynchronous circuit design language. In the module declaration, the module name "M" and the input/output signal name "P" are declared. In the input/output declaration, the port P is declared to be cport active sync. The if statement describes that, if a value returned by probe(P) is 1 of 1-bit, the statement "..." between the if statement and sync(P) command is executed. Although the probe command is used in the present example, the if statement is not essential for using the sync command and may be omitted.

FIG. 41 shows a Verilog code example of usage example 2 of sync command. In the module declaration, the module name "M" and the input/output signal name "P_ctrl, P_data" are declared. In the input/output declaration, an input signal P_data and an output signal P_ctrl are declared. The if statement is coded so that if a value of P_ctrl is 1 of 1-bit, the next statement ("..." between the if statement and begin statement) is executed. The begin-end statement is Verilog code of sync(P) command. In this begin-end statement, 1 of 1-bit is first output to P_ctrl, followed by waiting until P_data becomes not high impedance. When P_data becomes not high impedance, P_data is opened, and followed by waiting until P_data is negated.

According to the present embodiment, there is provided an environment in which an engineer well versed in the industry standard HDL (Verilog HDL and VHDL) can easily design asynchronous circuits. Further, this makes it possible to exploit, with high reliability and verifiability, the performance by a process in a shorter period at lower costs than conventionally available beyond limitations (problems of electric power, clock skew, and the like) of asynchronous circuit design that have come to the surface with advances in micro-miniaturization of semiconductor processes. Still further, because of high portability of asynchronous circuits, it is possible to use repeatedly the asynchronous circuit design techniques developed by the present invention as an intellectual property (IP), thereby making it possible to cope with a shortage of engineers and a short period development. Furthermore, through the present invention, it is possible to provide an environment for developing asynchronous circuits having extremely small electromagnetic radiation for a variety of products. The asynchronous circuit design technology of the present invention is applicable to VLSI of ultra low power consumption, semi-finished products or finished products incorporating it (PDAs, smart cards, electronic books and the like), LSI using the TFT techniques, and semi-finished products or finished products incorporating it. Specifically, its application extends to wearable equipment, toys, home security sensor equipment, RFID and other electronic equipment with no battery mounted, equipment mounted on automobiles, medical devices and equipment, military products, and the like.

What is claimed is:

1. An asynchronous circuit design tool, comprising:
a logic synthesis tool that directly translates a code written in an asynchronous circuit design language into a netlist, the asynchronous circuit design language being based on a subset or fullset of a hardware description language and including primitives for describing communications between asynchronous circuit blocks or processes,
the asynchronous circuit design language including:
instantiation statements, each of which includes a process name instantiated, an instance name, and a list of arguments; and
channel declaration statements, each of which includes a channel name, and a channel width; and
the netlist including:
sub-processes targeted;
bundles each including data lines in a number that is twice as large as the channel width of a respective channel declaration statement; and
control lines.

2. The asynchronous circuit design tool according to claim 1, wherein the logic synthesis tool further includes a cell library that contains geographic and electric information of both cells and leaves for the logic synthesis tool to generate the netlist.

3. The asynchronous circuit design tool according to claim 2, the cell library including a synchronous circuit design and an asynchronous circuit design.

4. The asynchronous circuit design tool according to claim 2, the asynchronous circuit design tool being configured to generate the netlist by referring to the cell library.

5. The asynchronous circuit design tool according to claim 2, the netlist being a Verilog netlist.

6. The asynchronous circuit design tool according to claim 2, each of the cell including a 1-bit dual-rail decoder.

7. The asynchronous circuit design tool according to claim 1, further comprising a simulator configured to verify the netlist in order to fix the code.

8. A computer program product comprising software instructions that enable a computer system to perform predetermined operations and a computer readable medium including the software instructions, the predetermined operations comprising:
directly translating a code written in an asynchronous circuit design language into a netlist, the asynchronous circuit design language being based on a subset or fullset of a hardware description language and including primitives for describing communications between asynchronous circuit blocks or process,
the asynchronous circuit design language including:
instantiation statements, each of which includes a process name instantiated, an instance name, and a list of arguments; and
channel declaration statements, each of which includes a channel name, and a channel width; and
the netlist including:
sub-processes targeted;
bundles each including data lines in a number that is twice as large as the channel width of a respective channel declaration statement; and
control lines.

9. An asynchronous circuit design tool, comprising:
a logic synthesis tool that directly translates a code written in an asynchronous circuit design language into a netlist, the asynchronous circuit design language being based on a subset or fullset of a hardware description language and including primitives for describing communications between asynchronous circuit blocks or processes,
the asynchronous circuit design language including:
communication port declaration statements, each of which includes:
a port name;
a port width;
an operational attribute that is one of input, output, or sync; and
an initiative attribute that is one of active or passive, and
command statements, each of which includes:
a command name that is one of send, receive or sync;
a name of a port declared in the corresponding communication port declaration statement; and
a variable that is used to store data transferred via the corresponding communication port, and
the netlist including:
bundles each including data lines in a number that is two times as large as the port width of a respective communication port declaration statement;
control lines; and
sequence control circuits, which control four-phase handshaking.

* * * * *